United States Patent
Arai et al.

[19]

[11] Patent Number: 5,963,016
[45] Date of Patent: Oct. 5, 1999

[54] BATTERY RESIDUAL CAPACITY MEASURING SYSTEM AND BATTERY RESIDUAL CAPACITY MEASURING FOR ELECTRIC VEHICLES

[75] Inventors: Yoichi Arai; Kenichi Shimoyama; Tsutomu Saigo; Ryo Kumagai, all of Susono, Japan

[73] Assignee: Yazaki Corporation, Tokyo, Japan

[21] Appl. No.: 08/866,389

[22] Filed: May 30, 1997

[30] Foreign Application Priority Data

May 30, 1996 [JP] Japan ................................. 8-137113

[51] Int. Cl.$^6$ .............................. H02J 7/00; H01M 10/48
[52] U.S. Cl. .......................... 320/132; 320/134; 429/90; 324/427; 340/636
[58] Field of Search .................................. 320/134, 136, 320/DIG. 21; 324/427, 428; 340/636; 429/90

[56] References Cited

U.S. PATENT DOCUMENTS

| | | | |
|---|---|---|---|
| 5,341,084 | 8/1994 | Gotoh et al. | 324/427 |
| 5,394,089 | 2/1995 | Clegg | 324/427 |
| 5,561,362 | 10/1996 | Kawamura et al. | 320/134 |
| 5,631,540 | 5/1997 | Nguyen | 320/103 |
| 5,644,212 | 7/1997 | Takahashi | 320/134 |
| 5,703,486 | 12/1997 | Arai et al. | 324/427 |
| 5,744,931 | 4/1998 | Arai et al. | 320/149 |
| 5,793,211 | 8/1998 | Shimoyama | 324/427 |
| 5,798,646 | 8/1998 | Arai | 324/427 |
| 5,872,453 | 2/1999 | Shimoyama et al. | 324/431 |

*Primary Examiner*—Peter S. Wong
*Assistant Examiner*—Gregory J. Toatley, Jr.
*Attorney, Agent, or Firm*—Oblon, Spivak, McClelland, Maier & Neustadt, P.C.

[57] ABSTRACT

In each time slot, along with processing collected sets of amperage data and voltage data and a data on a reference current to provide a first value as an estimated residual capacity for a normal travelling, the amperage data are processed to provide a second value representative of a discharge quantity, and the second value is subtracted from the first value to provide a third value as a residual capacity for a high load condition, permitting the first value to be displayed in the normal travelling and the third value to be displayed under the high load condition, as this condition is detected by checking a significance of correlation in dispersion of the collected sets of data.

10 Claims, 8 Drawing Sheets

BATTERY RESIDUAL CAPACITY MEASURING SYSTEM AND BATTERY RESIDUAL CAPACITY MEASURING FOR ELECTRIC VEHICLES

BACKGROUND OF THE INVENTION

1. Field of the Invention

The present invention generally relates to a battery residual capacity measuring system and a battery residual capacity measuring method for electric vehicles, and particularly, it relates to a battery residual capacity measuring system and a battery residual capacity measuring method for electric vehicles in which a defined current residual capacity of a battery is determined to be displayed in consideration of a characteristic of the battery even in a fully accelerated travelling of the vehicle.

2. Description of Relevant Art

Generally, the battery has a variety of discharge characteristics in dependence on a load and a temperature. Discharge current and terminal voltage of battery violently vary, as the load varies.

It therefore is not easy to define a residual capacity of a battery. The residual capacity of battery yet tends to substantially linearly descend with time. Typically, it thus has been determined, relying on this tendency.

For example, in electric vehicles in recent years, a conventional system for measuring a residual capacity of an installed battery samples data on a battery discharge current (hereafter simply "amperage") and data on a battery terminal voltage (hereafter simply "voltage") at intervals of a predetermined time during a travel, and calculates a correlation coefficient between sampled amperage data and sampled voltage data to have an approximate line determined therefrom to be mapped in a coordinate system defined by an amperage axis and a voltage axis, as the coefficient exhibits a significant negative or high correlation.

The measurement system then reads an intersect between the approximate line and a representative line of a preset reference amperage, as a point corresponding to a residual capacity to be displayed.

The vehicle travels along a road that may incline and decline.

At a steep incline, it may be fully accelerated along the distance. In such a fully accelerated travelling (hereafter sometimes "full acceleration" or "high load condition"), the battery tends to have amperage and voltage values concentrated about a point without significant variations, as illustrated in FIG. 1.

Therefore, sampled data fail to have a significant correlation in the amperage vs. voltage coordinate system, nor to serve for the measurement system to determine a defined current residual capacity.

For a correlation to be significant, sampled data should be dispersed on a plane defined by amperage and voltage axes of the coordinate system, as illustrated in FIG. 2.

In the case both amperage and voltage values are concentrated as in FIG. 1, therefore, the conventional system fails to update a previous residual capacity, which is thus left, as it is displayed, until the system detects a subsequent significant correlation.

Accordingly, during a travel interval under full acceleration, the previous residual capacity is kept displayed, disabling the driver to know a defined current residual capacity.

In other words, over an interval of travel with high load, as an identical value to the previous value is displayed, the displayed residual capacity does not change despite an increasing travel distance, as illustrated in FIG. 3.

As a result, the displayed residual capacity has an erroneous value during full acceleration.

SUMMARY OF THE INVENTION

The present invention has been achieved with such points in mind.

It therefore is an object of the present invention to provide a battery residual capacity measuring system and a battery residual capacity measuring method for electric vehicles, in which a defined current residual capacity is informed even under full acceleration.

To achieve the object, a first aspect of the invention provides a battery residual capacity measuring system for electric vehicles, the system comprising: first means (7) for detecting a discharge current of a battery (3) to provide a first data (I); second means (5) for detecting a discharge voltage of the battery to provide a second data (V); third means (9, 15, 17) for processing the first and the second data and a third data (Io) on a reference current to estimate a first value (q) representative of a residual capacity of the battery under a first condition (A, B); fourth means (17, 19, 21) for processing the first data to provide a second value (k, p) representative of a discharge quantity of the battery; and fifth means (22) for subtracting the second value from the first value to provide a third value (q–k, q–p) representative of the residual capacity of the battery under a second condition higher in load than the first condition.

According to the first aspect, a defined current residual capacity (q or q–k/q–p) is informable even under full acceleration with high load.

According to a second aspect of the invention, as it depends from the first aspect, the system further comprises sixth means (11) for detecting a recovery current of the battery to provide a detection signal, and the fourth means (17, 19, 21) is responsible for the detection signal to have the second value (k) representing a cancelled discharge.

According to the second aspect, a recovering state of battery is excluded from an amperage integration to determine a discharge quantity.

According to a third aspect of the invention, as it depends from the first aspect, the system further comprises display means (14) for displaying the first value (q) under the first condition and the third value (q–k, q–p) under the second condition.

According to the third aspect, effective information is provided.

According to a fourth aspect of the invention, as it depends from the first aspect, the third means (9, 15, 17) comprises a data sampling means (9) for sampling the first and the second data to provide a set (In, Vn) thereof, a data storing means (17) for storing the set of the first and the second data to have a plurality of sets of data (D(Im), D(Vm)) collected therein, and a data processing means (15) for processing the plurality of sets of collected data by a method of least squares to estimate an approximate line (V=aX+b) to a linear function of the discharge current with respect to the discharge voltage and for processing the third data (Io) to calculate the first value (q) from an intersect between the approximate line and the reference current.

According to the fourth aspect, a defined current residual capacity is estimatable under a first condition.

According to a fifth aspect of the invention, as it depends from the fourth aspect, the fifth means (22) checks the plurality of sets of collected data (D(Im), D(Vm)) for a significant correlation (rθ≧r) in dispersion thereof to tell the first condition (A, B) from the second condition.

According to the fifth aspect, a defined current residual capacity is calculatable under a second condition.

According to a sixth aspect of the invention, as it depends from the first aspect, the fourth means (19, 21) comprises a data integration means (19) for integrating the first data (I) to determine an integrated value (k), and a clearing means (21) for clearing the integrated value (k), as it is read as the second value (k) and subtracted from the first value (q).

According to the sixth aspect, an amperage integration represents a discharge quantity in a current time slot.

According to a seventh aspect of the invention, as it depends from the sixth aspect, the fourth means (17, 19, 21) further comprises a data storage means (17) for storing the integrated value (k) and a preset value (p), and the fifth means (22) reads as the second value (k,p) one of the integrated value (k) and the preset value (p), as the integrated value (k) is significant (k>p) relative to the preset value (p).

According to the seventh aspect, the more defined current residual capacity is calculatable.

Further, to achieve the object described, an eighth aspect of the invention provides a battery residual capacity measuring method for electric vehicles, the method comprising the steps of: detecting a discharge current of a battery (3) to provide a first data (I); detecting a discharge voltage of the battery to provide a second data (V); processing the first and the second data and a third data (Io) on a reference current to estimate a first value (q) representative of a residual capacity of the battery under a first condition (A, B); processing the first data to provide a second value (k, p) representative of a discharge quantity of the battery; and subtracting the second value from the first value to provide a third value (q−k, q−p) representative of the residual capacity of the battery under a second condition higher in load than the first condition.

According to the eighth aspect, similar effects to the first aspect are provided.

According to a ninth aspect of the invention, as it depends from the eighth aspect, the method further comprises a step of detecting a recovery current of the battery to provide a detection signal, and the step of processing the first data (I) includes responding to the detection signal to have the second value (k) representing a cancelled discharge.

According to the ninth aspect, similar effects to the second aspect are provided.

According to a tenth aspect of the invention, as it depends from the eighth aspect, the method further comprises a step of displaying the first value (q) under the first condition and the third value (q−k, q−p) under the second condition.

According to the tenth aspect, similar effects to the third aspect are provided.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1:
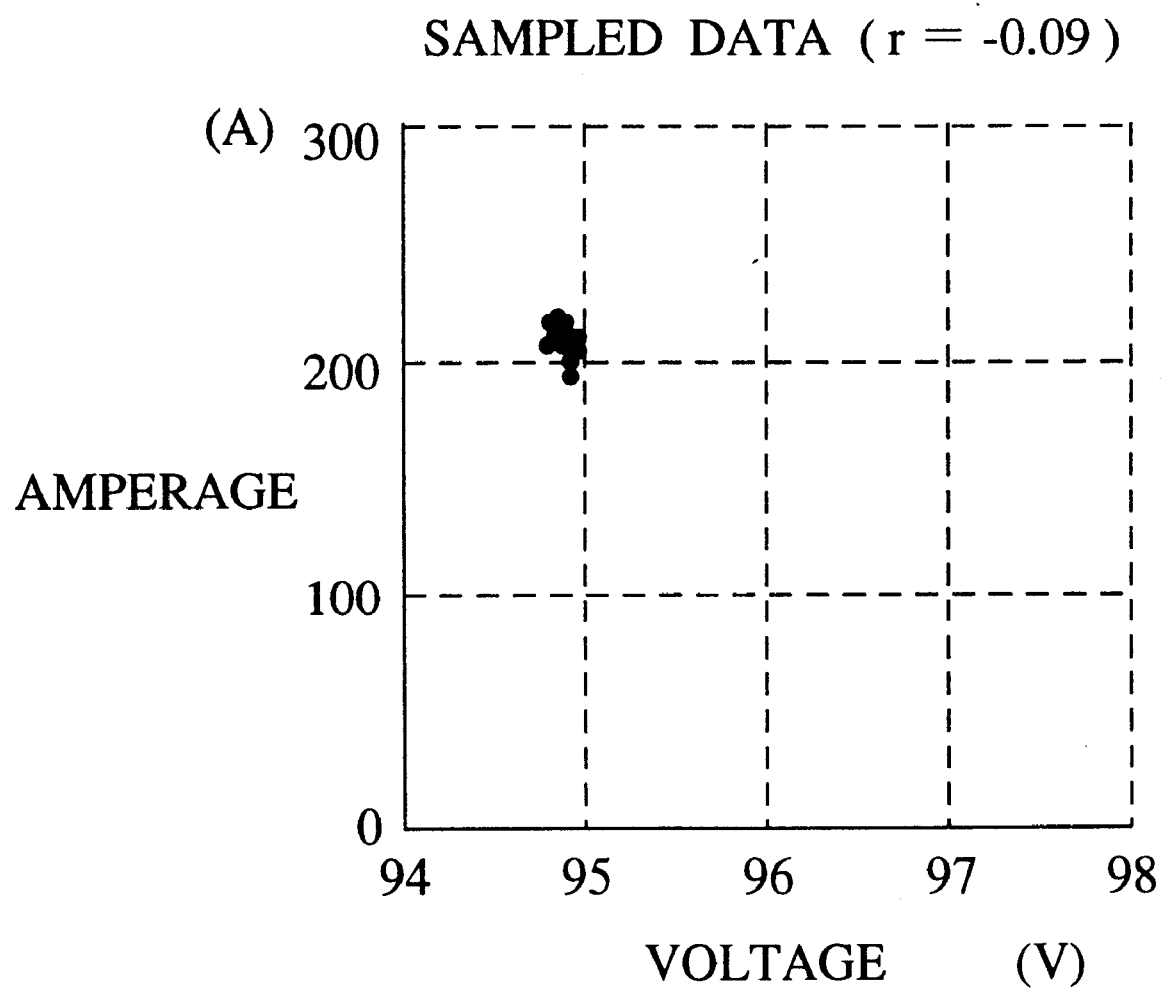
FIG. 1 is an illustration of concentrated sets of amperage and voltage data, as they are sampled under full acceleration at an incline of road and mapped in a coordinate system defined by amperage and voltage axes.
Figure 2:
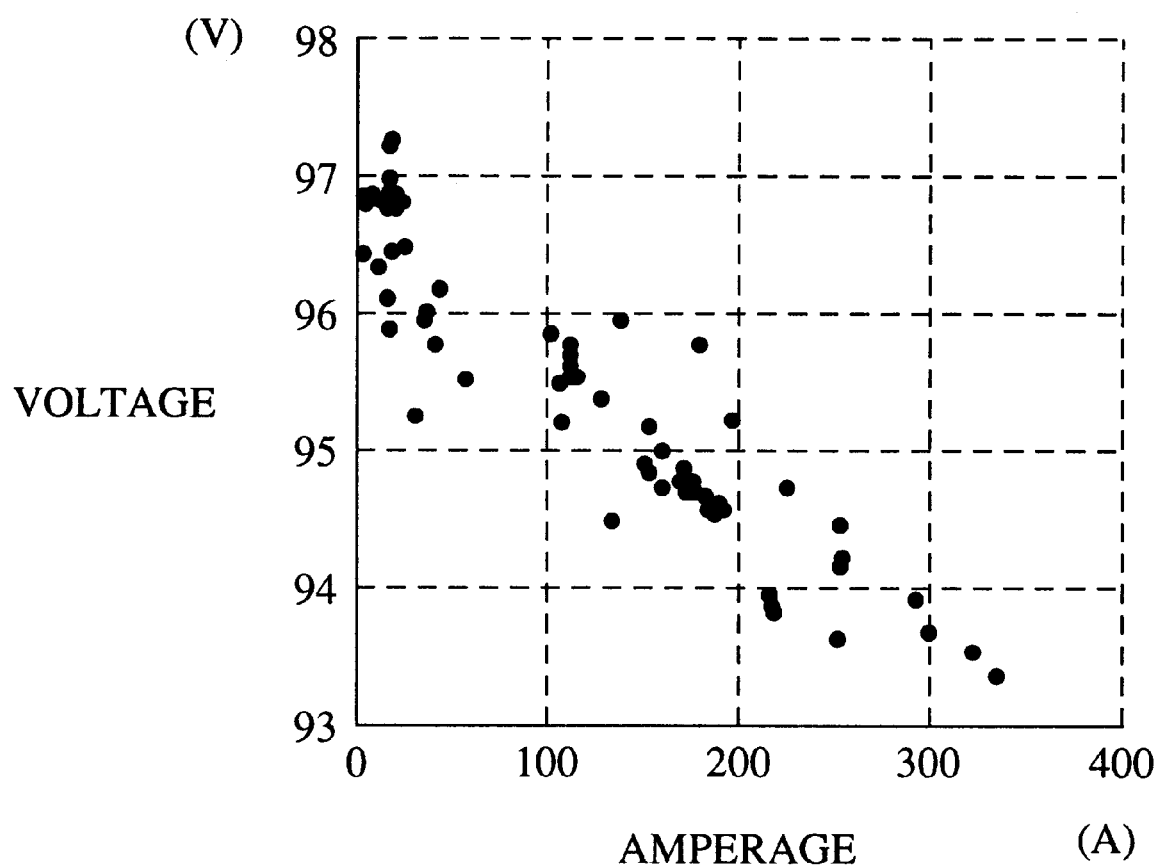
FIG. 2 is an illustration of dispersed sets of amperage and voltage data, as they are sampled while travelling and mapped in a coordinate system defined by amperage and voltage axes.
Figure 3:
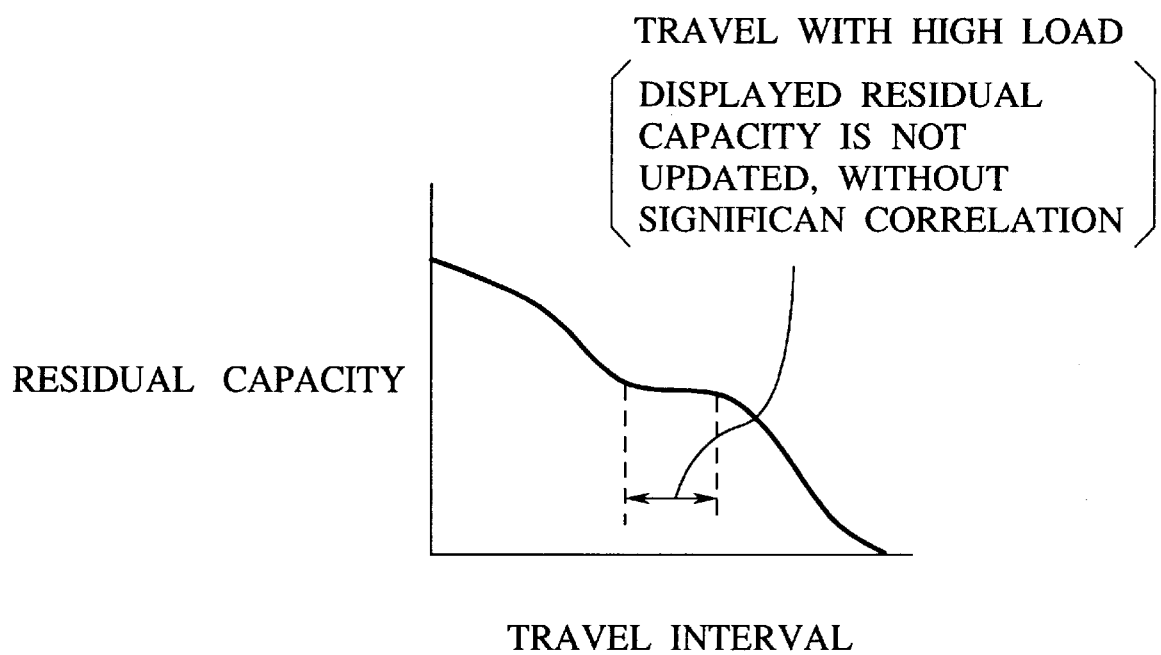
FIG. 3 is an illustration of a displayed residual capacity.

There will be detailed below the preferred embodiments of the present invention with reference to the accompanying drawings. Like members are designated by like reference characters.

Figure 4:
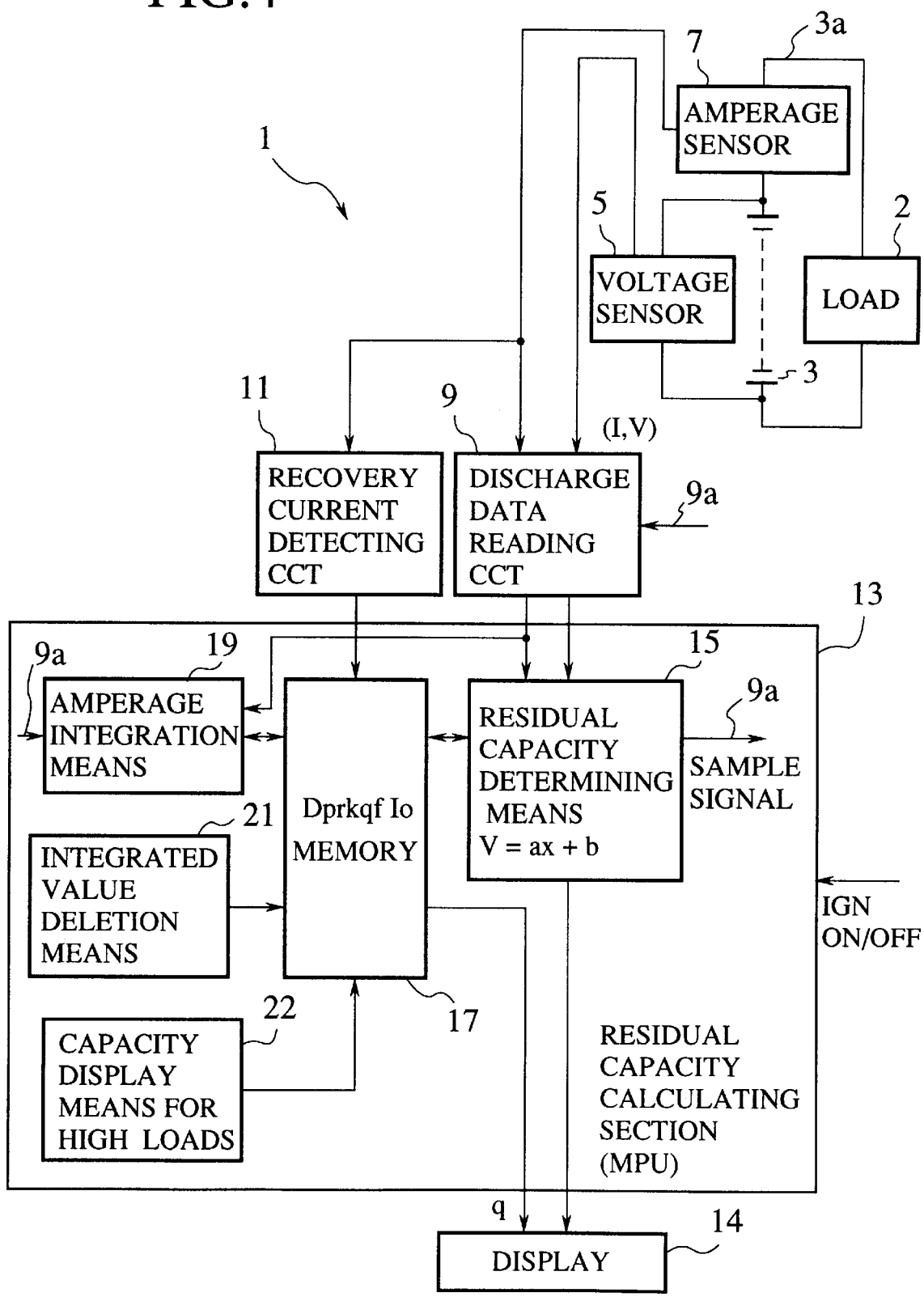
FIG. 4 is a block diagram of a battery residual capacity measuring system in an electric vehicle according to an embodiment of the invention.

FIG. 4 shows a battery residual capacity measuring system 1 according to an embodiment of the invention.

The battery residual capacity measuring system 1 is installed in an electric vehicle that has an electric load 2 such as a main motor, and a battery 3 composed of serially connected cells for supplying electric power to the load 2 through a power supply line 3a.

The residual capacity measuring system 1 includes: a voltage sensor 5 connected in parallel to the battery 3 for detecting a voltage V across terminals of the battery 3; an amperage sensor 7 installed on the line 3a for detecting an amperage I of an electric current conducted through the line 3a, as it is positive (I>O) in a discharge direction and negative (I<O) in a recovery direction; and a discharge data reading circuit 9 responsive to a sampling signal 9a for sampling every 1 msec a set (I, V) of n-th (where n is an arbitrary integer) instantaneous values In, Vn of the amperage I and voltage V detected by the sensors 7 and 5, respectively, to provide a set (I, V) of digitized amperage and voltage data In, Vn as a set of discharge data.

The measuring system 1 further includes a recovery current detecting circuit 11 for checking a sign of the amperage I detected at the sensor 7 to thereby detect a recovery current conducted through the line 3a, such as when running down a decline of road. If the detected amperage has a negative value (I<O), the circuit 11 outputs a signal for setting a recovery current flag f.

The system 1 further includes: an MPU (main processor unit) as a residual capacity calculating section 13 that comprises an unshown CPU with a ROM, a memory 17 as a RAM, and program files stored in the ROM as data processing means including an amperage integration means 19, an integrated value deletion means 21 and a capacity display means for high load, as well as a residual capacity determining means 15; and a display 14.

The MPU turns on and off, as an unshown ignition switch turns on and off. While the MPU is kept on, the recovery current detection circuit 11 is kept alive to monitor the amperage sensor 7 for a detection of a recovery current (I<O).

The residual capacity determining means 15 is adapted to: read a set (I, V) of discharge data from the circuit 9, identifying respective data I, V therein as In, Vn, storing them in the memory 17, where they are collected in order (as a set D of collected data D(In)+D(Vn)); read a total number of sets D of collected amperage data D(In) and collected voltage data D(Vn), processing them to obtain a set (I, V) of averaged and identified amperage and voltage data Im and Vm (where m is an arbitrary integer), storing them in the memory 17, where they are collected in order (as a set D of collected data D(Im)+D(Vm)); calculate a componentwise integration of the set (I, V) of averaged amperage and voltage data Im and Vm and an integration of a product I×V (=Im×Vm), storing resultant values in the memory 17; read to process stored data for calculating by a method of least squares a correlation coefficient r of a total number of sets D of collected data D(Im) and D(Vm), storing a resultant value in the memory 17; and respond to a significant negative correlation ($-0.9 \geq r \geq -1$) to have an approximate line V=aX+b determined in a coordinate system defined by amperage and voltage axes, where V is voltage, X is amperage, and "a" and "b" are calculated constants.

Then, it determines a residual capacity of the battery 3 on bases of the approximate line and a reference value. The result is stored in the memory 17 as a display data q to be displayed on a display 14.

The amperage integration means 19 integrates a current amperage In to a result of a previous integration, and stores a result k of the current integration in the memory 17, thereby updating the previous result.

The integrated value deletion means 21 checks the memory 17 for a recovery current flag f set therein or for a correlation coefficient r of a significant negative correlation ($-0.9 \geq r \geq -1$), and if this or that is stored, executes a deletion of the stored result k of amperage integration.

The capacity display means 22 for high load checks the memory 17 for a stored result k of amperage integration exceeding a preset value p, and if such a result k is stored, the value p or k is subtracted from the stored residual capacity q to be displayed.

In the embodiment, the preset value p to be compared for subtraction is assumed to be a 1%, as an integration of amperage data In over the predetermined time statistically amounts substantially to 1% of a total capacity of the battery 3. The value p may be a 1% of residual capacity.

The residual capacity calculating section 13, which includes the residual capacity determining means 15 and the memory 17, is thus adapted by the means 19, 21, 22 for a concurrent calculation of amperage integration permitting a defined current residual capacity q to be determined and displayed even in a special travelling state.

Figure 5:
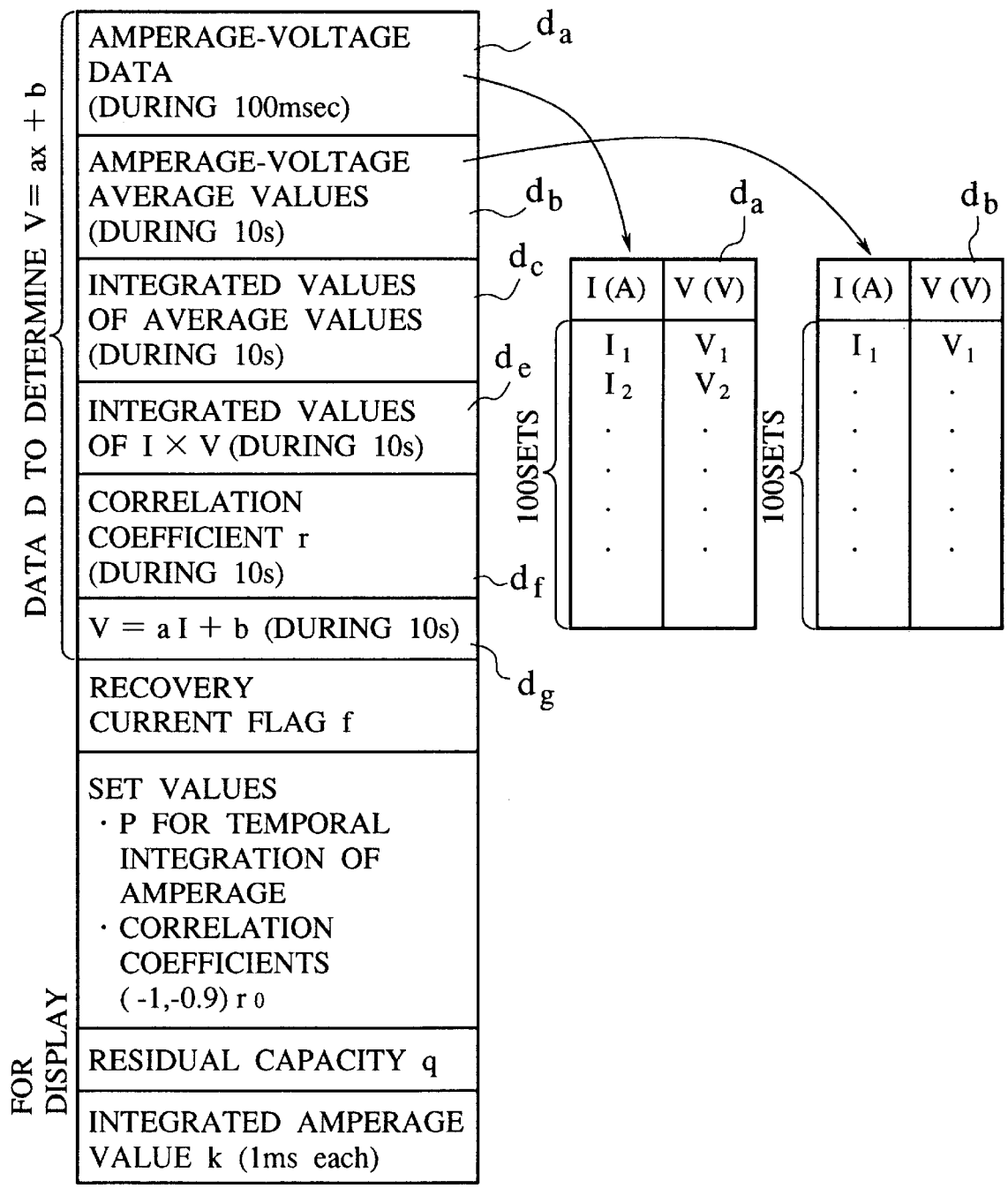
FIG. 5 is an illustration describing data storage regions of a memory of the system of FIG. 4.

FIG. 5 is an illustration describing data storage regions of a memory of the system of FIG. 4.

As shown in FIG. 5, for storage of necessary data to determine and define the approximate line V=aX+b, the memory 17 has: a discharge data storage region $d_a$ for storing the set (I, V) of identified amperage data In and voltage data Vn every 1 msec over a period of 100 msec so that there is collected a total of 100 sets of data In and Vn; an average value storage region $d_b$ for storing the set (I, V) of averaged amperage data Im and voltage data Vm every 100 msec over a period of 10 sec (=100×100 msec) so that there is collected a total of 100 sets of data Im and Vm; an integrated value storage region $d_e$ for storing a result of a current componentwise integration of the set of averaged amperage and voltage data Im and Vm every 10 sec; another integrated value storage region $d_e$ for storing a result of a current integration of a product I×V every 10 sec; a correlation coefficient storage region $d_f$ for storing the calculated correlation coefficient r every 10 sec; and a constant storage region $d_g$ for storing the calculated constants "a" and "b" as linear coefficients every 10 sec.

For a concurrent amperage integration and display, the memory 17 further has regions for storing the recovery current flag f, the preset value p for comparison with a temporal integration of amperage value, a marginal correlation coefficient r θ (=−0.9) to define a significance of negative correlation, the residual capacity q calculated by the residual capacity determining means 15, and a result k of a current integration of amperage In.

Figure 6:
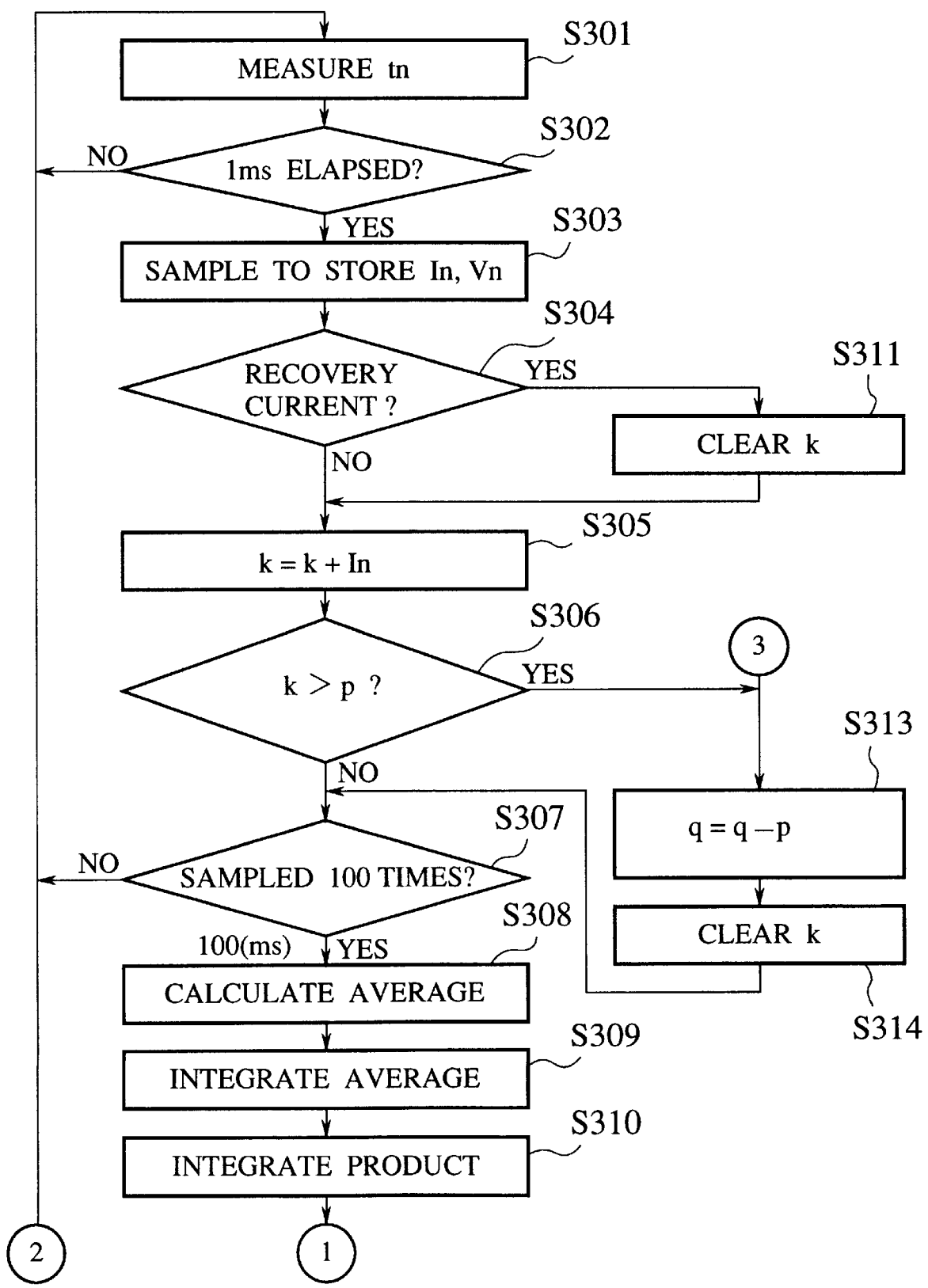
FIGS. 6 and 7 are flow charts cooperatively describing a flow of programmed actions of the system of FIG. 4.
Figure 7:
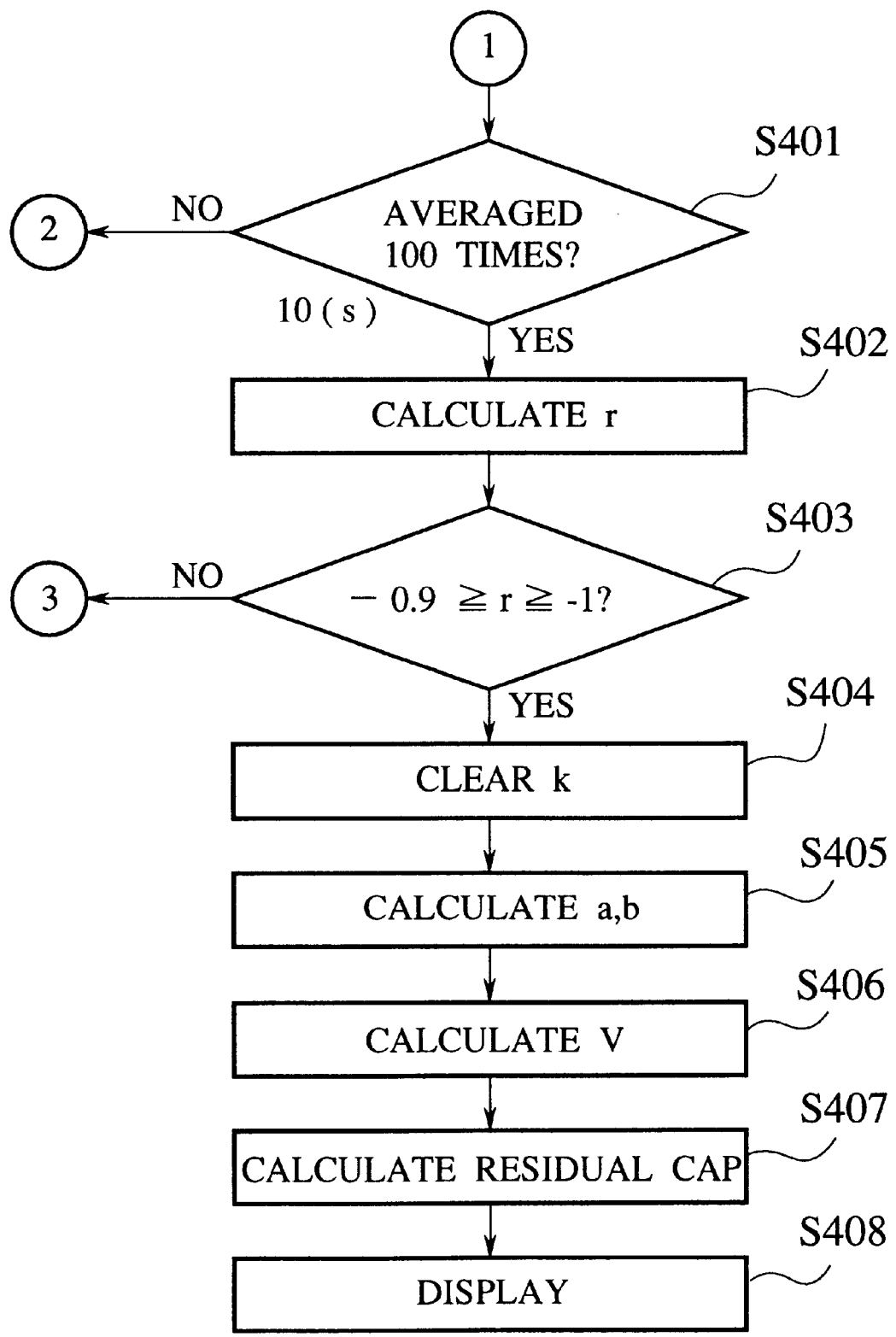

FIGS. 6 and 7 are flow charts cooperatively describing a flow of programmed actions of the system of FIG. 4.

As shown in FIG. 6, at a first step S301, a routine of a residual capacity determining file 15 is called for measuring an interval tn of time for the sampling.

At a decision step S302, the file 15 checks if a 1 msec period has elapsed. If it is so, the program flow goes to a subsequent step S303. Unless it is so, the flow again goes to the step S301.

At the step S303, the sampling signal 9a is output, so that the discharge data reading circuit 9 samples to output a set (I, V) of amperage and voltage data In and Vn, which set is input to the CPU, where the amperage and voltage data are identified to be output as In and Vn to the memory 17, where they are stored in a one-to-one corresponding manner to the sampling time tn. Then, the flow goes to a decision step S304.

At the step S304, an integrated value deletion file 21 checks the memory 17 for a stored recovery current flag f, to thereby decide whether or not a recovery current has been conducted through the power supply line 3a during a time slot ($t_n - t_{n-1}$) in concern.

If the flag f is set, the flow goes to a step S311 for deleting a stored result k of a previous integration of amperage, so that k is cleared to a zero, before the flow goes to a step S305.

If the flag f is not set at the step S304, the file 21 exercises a decision that no recovery current has been conducted. Then, the flow directly goes to the step S305.

At the step S305, an amperage integration file 19 adds the current amperage In to the result k of the previous amperage integration, as it is read from the memory 17, to obtain a current value k of an integration (for $1 \leq i \leq n$) of a product between an amperage Ii and an increment $t_i - t_{i-1}$ (=1 msec) of time. In other words, k=k+In. The result k of the current amperage integration is stored in the memory 17, where k is updated.

Then, the flow goes to a decision step S306, where the integrated value deletion file 21 checks if the stored result k of amperage integration has exceeded the preset value p that is 1% of the total capacity. If k>p, the flow goes via a step S313 and a step S314 to a subsequent decision step S307. Unless k>p, the flow directly goes to the step S307.

At the step S313, the preset value p is subtracted from the display data q, i.e. q=q−p. To this point, k may be subtracted from q, such that q=q−k. Or other-wise, a smaller one or larger one of p and k may be subtracted.

At the step S314, the file 21 deletes k, to clear or reset to zero.

At the step S307, it is checked if the discharge data have been sampled 100 times or if n≧100. Unless n≧100 (i.e. if n≦99), the flow again goes to the step S301.

If n≧100 (i.e. if n=100), the flow goes through a step S308, where the collected discharge data D(In) and D(Vn)

are averaged to obtain a set of averaged data Im and Vm, a step S309, where the averaged data Im and Vm are integrated, a step S310, where a product IxV of the averaged data Im and Vm is integrated, and via a node-1 to a step S401 shown in FIG. 7.

At the step S401, it is checked if average data Im, Vm of collected discharge data D(In), D(Vn) have been calculated 100 times or if m≧100. Unless m>100 (i.e. if m≧99), the flow goes via a node-2 to the step S301 of FIG. 6, to restart an (m+1)-th cycle of the foregoing steps.

If m≧100 (i.e. if m=100), the flow goes to a step S402, where the residual capacity determining file 15 reads from the memory 17 necessary data associated with a current 10 sec period, processing them to determine a current value of the correlation coefficient r. Then, the flow goes to a subsequent decision step S403.

At the step S403, a high-load oriented display file 22 checks if the correlation coefficient r is of a significant negative correlation or if rθ (=−0.9)≧r≧−1.

Unless it is so, the flow goes via a node-3 to the step S313 of FIG. 6, to decrease the display data q by the preset value p (or the integrated amperage k), which means the residual capacity q decrements by p (or k) with a lapse of 10 sec. The file 22 outputs the decreased data q to the display 14, where it is displayed as a current residual capacity in a high load condition, in an interpolating manner. To this point, the flow may go from the step S403 to the step S306 to neglect a minor k value.

If the correlation coefficient r has a significant negative value or if rθ (=−0.9)≧r≧−1, then the flow goes to a subsequent step S405 via a step S404, where the integrated value deletion file 21 resets k to a zero.

At the step S405, the residual capacity determining file 15 governs the flow. Accordingly, it calculates the constants "a" and "b", before entering a step S406, where it determines an approximate line V=aX+b representative of significant characteristics of a dispersion of sets of averaged amperage and voltage data Im and Vm in current 10 sec period.

At a step S407, the file 15 calculates a current residual capacity q from a cross point between the approximate line and a reference amperage (=−10 A), and outputs the calculated value q to the memory 17, where it is stored as a display data q.

Then, at a step S408, the file 15 reads the display data q from the memory 17 and outputs to the display 14, where it is displayed as a current residual capacity in a normal travelling with no recovery current nor full acceleration detected.

Figure 8:
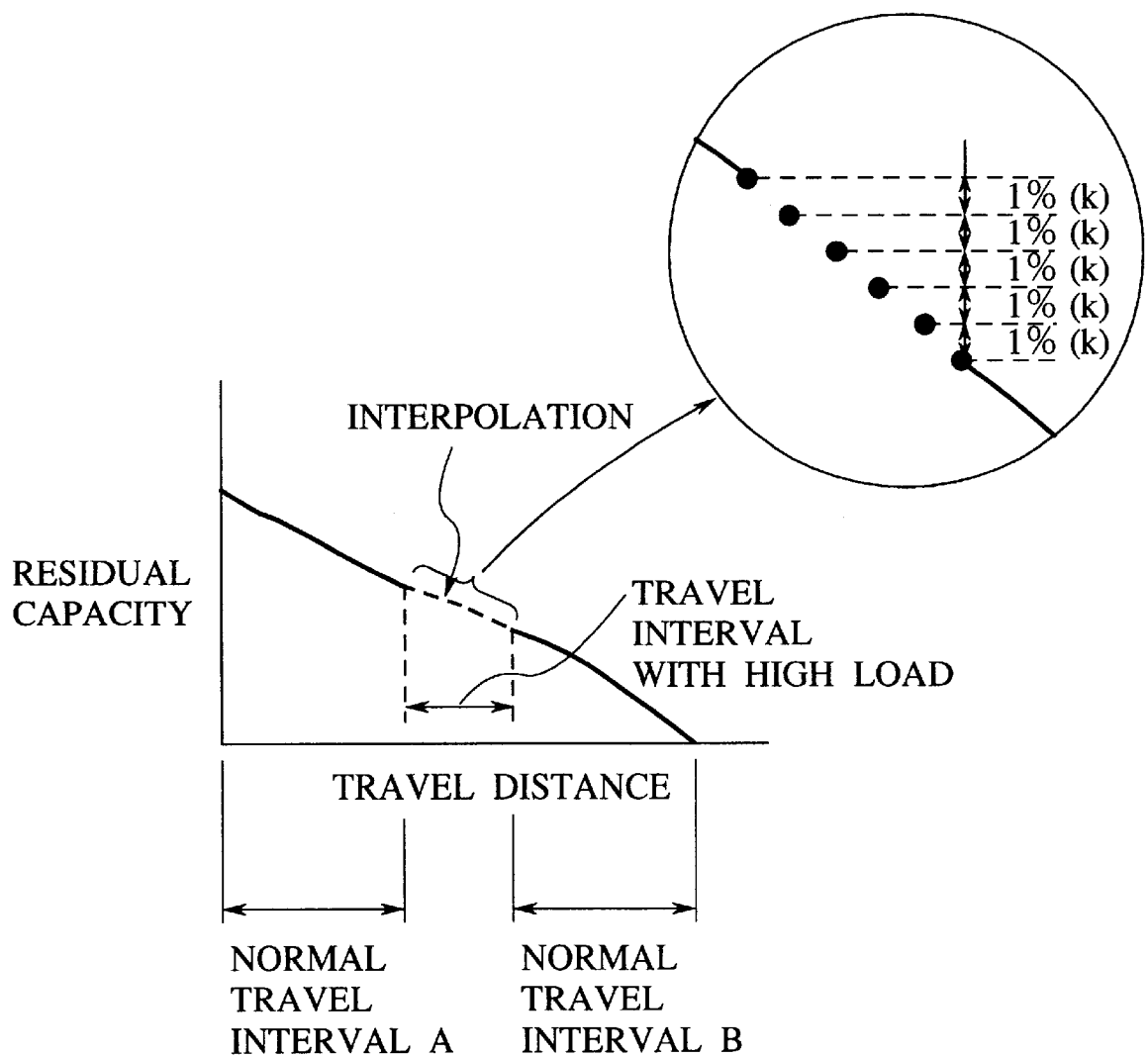
FIG. 8 is an illustration of a residual capacity to be displayed in the system of FIG. 4, including an interpolated section for a travelling with high load.

FIG. 8 is an illustration of a residual capacity to be displayed in the system of FIG. 4, including an interpolated section shown by broken lines for a travelling with high load.

In FIG. 8, the calculated residual capacity q is plotted on a plane defined by a residual capacity axis and a travel distance or time axis. As the travel distance or time increases, the residual capacity determining file 15 of system 1 describes a substantially descending curve in each normal travel interval A, B in which no recovery current nor full acceleration is detected. The calculated value q is stored as display data q.

During a travel interval under full acceleration (i.e. with high load), as the integrated amperage k exceeds a preset value p (=1% of total capacity), the display data q is decreased by p (or k) every time slot (=10 sec). The calculated value q at a right end of interval A thus disappears or changes between intervals A and B. However, the file 15 creates a new display data q at a left end of interval B. As the preset value p is adequate, the new data q has a matching or vicinal value to the display data q in a last time slot between intervals A and B.

Accordingly, the system 1 is permitted to continuously and/or stepwise describe a substantially descending curve, with a proximity kept to an actual residual capacity, all the way including a travel under full acceleration or with high load.

It will be seen that the sampled amperage data In represents a discharge rate of battery 3 per unit time (=1 msec), and the integrated amperage k denotes a discharge quantity at an n msec during a short time slot (=100 msec), which will represent a discharge rate of battery 3 per short time slot at n=100 if a load is constant, and the preset value p is a criterion to decide whether or not a fast reducing residual capacity q should be once updated or displayed in the way of reduction, as the load is constant.

In an aspect of the embodiment, the system 1 is adapted for instantaneously determining a residual capacity q from data (I, V) on a discharged quantity of capacity of a battery 3 while travelling, as well as for displaying the residual capacity q. In such arrangement, the system 1 is operable, along with the travelling, for integrating a discharge quantity I of the battery 3 at intervals of a predetermined time (=100 msec) in consideration of a charge (=recovery) and for employing an integrated value k as data for display when the residual capacity q is unable to measure.

Accordingly, the system 1 is permitted to display a defined residual capacity even under full acceleration.

In another aspect, the system 1 is adapted for collecting data (I, V) on a discharged quantity of capacity of a battery 3 at intervals of a predetermined time (=100 msec) while travelling, and is provided with a residual capacity determining means 15 for instantaneously determining a residual capacity q from the collected data to output the residual capacity q as a display data to a display. In such arrangement, the system 1 includes an integration means 19+22 for integrating a discharge quantity I of the battery 3 at intervals of the predetermined time (=100 msec) in consideration of a charge (=recovery) and for determining a residual capacity q−k from an integrated value k, and a high-load oriented capacity display means 22 operable for employing the residual capacity q−k of the integration means as the data q for display, when the system 1 is inadaptive for determining the residual capacity q from the collected data for the residual capacity determining means 15.

Accordingly, a possible substitution (of q−k) for a discharge quantity q per predetermined time allows for a display of a defined residual capacity even under full acceleration.

In another aspect, the system 1 is adapted for collecting data (I, V) on a discharged quantity of capacity of a battery 3 at intervals of a predetermined time (=100 msec) while travelling, and is provided with a residual capacity determining means 15 for instantaneously determining a residual capacity q from the collected data to output the residual capacity q as a display data to a display. In such arrangement, the system 1 includes a high-load oriented capacity display means 19+22 operable, when the system 1 is inadaptive to determine the residual capacity q from the collected data, for integrating a discharge quantity I of the battery 3 at intervals of the predetermined time (=100 msec) in consideration of a charge (=recovery) and for subtracting an integrated value k from the residual capacity q determined by the residual capacity determining means 15 to employ a resultant value q−k as the data q for display.

Accordingly, a residual capacity may be displayed in a stepwise descending manner even under full acceleration.

In another aspect, the system 1 is adapted for collecting data (I, V) on a discharged quantity of capacity of a battery 3 at intervals of a predetermined time (=100 msec) while travelling, and is provided with a residual capacity determining means 15 for instantaneously determining a residual capacity q from the collected data to output the residual capacity q as a display data to a display. In such arrangement, the system 1 includes an integration means 19 for simply integrating a discharge quantity I of the battery 3, a high-load oriented capacity display means 22 operable, as an integrated value k by the integration means 19 has exceeded a preset value p, for subtracting the integrated value k from the residual capacity q to employ a resultant value q−k as the data q for display, and an integrated value deletion means 21 for a deletion of the integrated value k of the integration means 19.

Accordingly, a favorable residual capacity can be displayed.

The integrated value deletion means 21 exercises the deletion of the integrated value k, when the battery 3 is charged (=recovered) during the travel, or when the residual capacity q is determined from the collected data in an adequate manner, or when the integrated value k has exceeded the preset value p.

Accordingly, the system 1 is permitted to calculate a discharge capacity q−k from a data k excluding a recovery current, and to display a residual capacity q in a normal travelling and the residual capacity q−k based on the integrated value k under full acceleration.

While preferred embodiments of the present invention have been described using specific terms, such description is for illustrative purposes, and it is to be understood that changes and variations may be made without departing from the spirit or scope of the following claims.

What is claimed is:

1. A battery residual capacity measuring system for electric vehicles, the system comprising:
    first means for detecting a discharge current of a battery to provide a first data;
    second means for detecting a discharge voltage of the battery to provide a second data;
    third means for processing the first and the second data and a third data on a reference current to estimate a first value representative of a residual capacity of the battery under a first condition;
    fourth means for processing the first data to provide a second value representative of a discharge quantity of the battery; and
    fifth means for subtracting the second value from the first value to provide a third value representative of the residual capacity of the battery under a second condition higher in load than the first condition.

2. A battery residual capacity measuring system according to claim 1, wherein:
    the system further comprises sixth means for detecting a recovery current of the battery to provide a detection signal; and
    the fourth means is responsible for the detection signal to have the second value representing a cancelled discharge.

3. A battery residual capacity measuring system according to claim 1, further comprising:
    display means for displaying the first value under the first condition and the third value under the second condition.

4. A battery residual capacity measuring system according to claim 1, wherein the third means comprises:
    a data sampling means for sampling the first and the second data to provide a set thereof;
    a data storing means for storing the set of the first and the second data to have a plurality of sets of data collected therein; and
    a data processing means for processing the plurality of sets of collected data by a method of least squares to estimate an approximate line to a linear function of the discharge current with respect to the discharge voltage and for processing the third data to calculate the first value from an intersect between the approximate line and the reference current.

5. A battery residual capacity measuring system according to claim 4, wherein:
    the fifth means checks the plurality of sets of collected data for a significant correlation in dispersion thereof to tell the first condition from the second condition.

6. A battery residual capacity measuring system according to claim 1, wherein the fourth means comprises:
    a data integration means for integrating the first data to determine an integrated value; and
    a clearing means for clearing the integrated value, as it is read as the second value and subtracted from the first value.

7. A battery residual capacity measuring system according to claim 6, wherein:
    the fourth means further comprises a data storage means for storing the integrated value and a preset value, and
    the fifth means reads as the second value one of the integrated value and the preset value, as the integrated value is significant relative to the preset value.

8. A battery residual capacity measuring method for electric vehicles, the method comprising the steps of:
    detecting a discharge current of a battery to provide a first data;
    detecting a discharge voltage of the battery to provide a second data;
    processing the first and the second data and a third data on a reference current to estimate a first value representative of a residual capacity of the battery under a first condition;
    processing the first data to provide a second value representative of a discharge quantity of the battery; and
    subtracting the second value from the first value to provide a third value representative of the residual capacity of the battery under a second condition higher in load than the first condition.

9. A battery residual capacity measuring method according to claim 8, wherein:
    the method further comprises a step of detecting a recovery current of the battery to provide a detection signal; and
    the step of processing the first data includes responding to the detection signal to have the second value representing a cancelled discharge.

10. A battery residual capacity measuring method according to claim 8, further comprising a step of:
    displaying the first value under the first condition and the third value under the second condition.

* * * * *